(12) United States Patent
Sato

(10) Patent No.: US 6,281,964 B1
(45) Date of Patent: *Aug. 28, 2001

(54) PROJECTION EXPOSURE APPARATUS AND DEVICE MANUFACTURING METHOD

(75) Inventor: Hiroshi Sato, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/066,840

(22) Filed: Apr. 28, 1998

(30) Foreign Application Priority Data

Apr. 30, 1997 (JP) .................................................. 9-126335

(51) Int. Cl.⁷ .............................. G03B 27/42; G03B 27/72
(52) U.S. Cl. .................................. 355/53; 355/69; 355/71
(58) Field of Search ................................. 355/53, 67, 68, 355/69, 71; 250/492.22

(56) References Cited

U.S. PATENT DOCUMENTS

| | | | |
|---|---|---|---|
| 4,521,082 | 6/1985 | Suzuki et al. ...................... | 350/405 |
| 5,262,822 | * 11/1993 | Kosugi et al. ..................... | 355/53 |
| 5,305,054 | 4/1994 | Suzuki et al. ..................... | 355/53 |
| 5,459,547 | * 10/1995 | Shiozawa ........................... | 355/67 |
| 5,489,966 | * 2/1996 | Kawashima et al. ............... | 355/43 |
| 5,526,093 | * 6/1996 | Takahashi ......................... | 355/53 |
| 5,576,801 | * 11/1996 | Ushida et al. .................... | 355/53 |
| 5,726,739 | 3/1998 | Hayata .............................. | 355/67 |
| 5,726,793 | * 3/1998 | Hayata .............................. | 355/67 |
| 5,777,724 | * 7/1998 | Suzuki .............................. | 355/68 |
| 5,815,249 | * 9/1998 | Nishi et al. ..................... | 355/71 |
| 5,861,944 | * 1/1999 | Nishi ............................... | 355/68 |

FOREIGN PATENT DOCUMENTS

| | | |
|---|---|---|
| 1-42821 | 2/1989 | (JP) . |
| 5-47626 | 2/1993 | (JP) . |
| 5-47640 | 2/1993 | (JP) . |
| 6-84759 | 3/1994 | (JP) . |
| 7-37798 | 2/1995 | (JP) . |
| 7-183200 | 7/1995 | (JP) . |
| 9-36026 | 2/1997 | (JP) . |

\* cited by examiner

*Primary Examiner*—Russell Adams
*Assistant Examiner*—Hung Henry Nguyen
(74) *Attorney, Agent, or Firm*—Fitzpatrick, Cella, Harper & Scinto

(57) ABSTRACT

A projection exposure apparatus includes an illumination optical system for illuminating an original with light from a light source and a projection optical system for projecting a pattern of the original, illuminated with the light, onto a substrate to be exposed. The illumination optical system includes an optical integrator having a plurality of lenses, and a movable transparent substrate disposed juxtaposed to a light entrance surface of the optical integrator and being movable in a direction intersecting an optical axis. The transparent substrate has a light quantity adjusting film formed thereon for blocking a portion of light directed to at least one lens of the plurality of lenses to thereby change a light quantity distribution on the at least one lens so as to change an illuminance distribution on a plane to be illuminated.

29 Claims, 15 Drawing Sheets

FIG. 9A
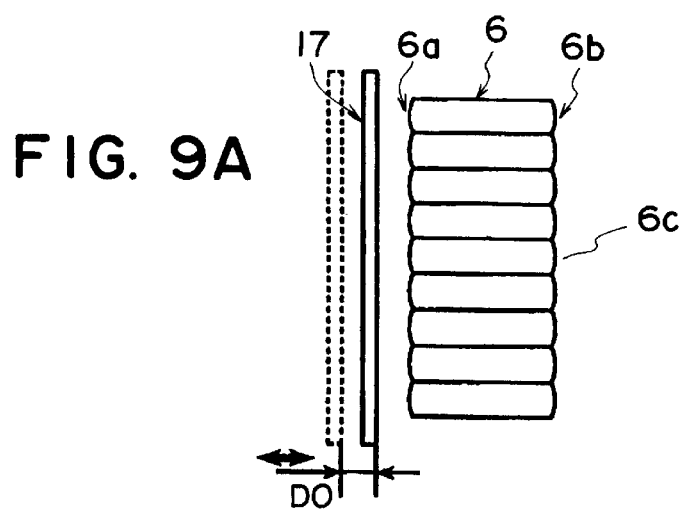
FIG. 9B
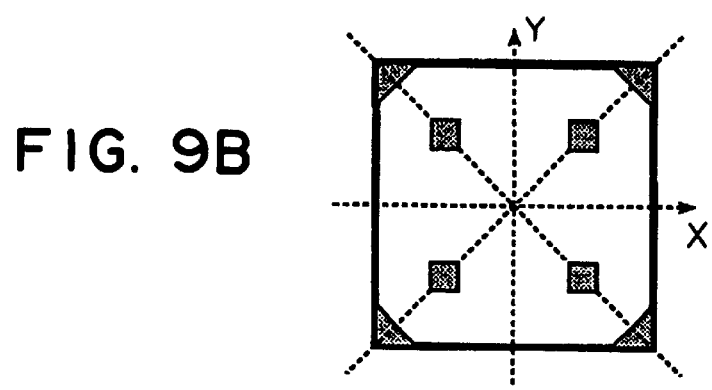
FIG. 9C
FIG. 9D
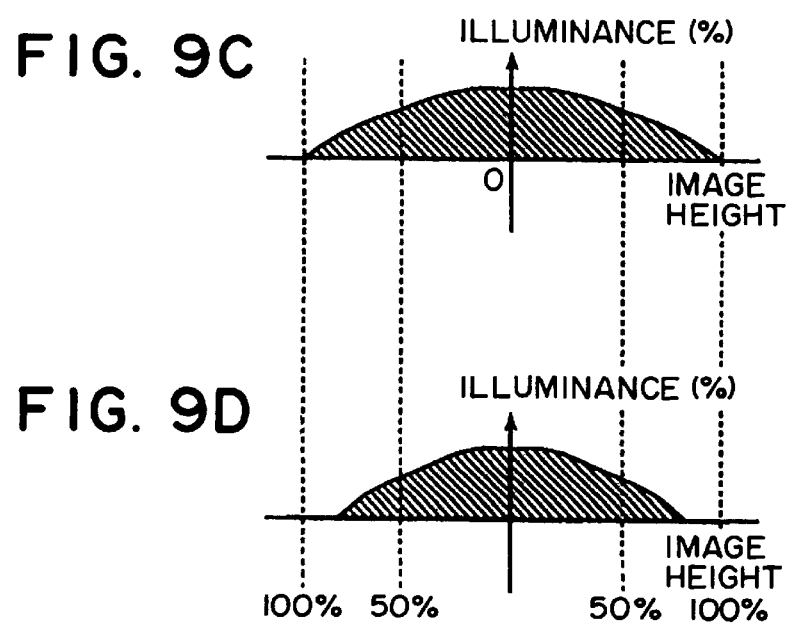

PROJECTION EXPOSURE APPARATUS AND DEVICE MANUFACTURING METHOD

FIELD OF THE INVENTION AND RELATED ART

This invention relates to a projection exposure apparatus and a device manufacturing method. Particularly, the invention is suitably usable for the manufacture of large integration devices (semiconductor devices) of submicron or guarter-micron linewidth, such as ICs, LSIs, CCDs or liquid crystal panels, for example, through projection exposure wherein a pattern of a first object such as a mask or reticle is illuminated with light of a uniform illuminance distribution so that the pattern of the first object is transferred to a second object such as a silicon or glass wafer in accordance with a step-and-repeat method or step-and-scan method.

In projection exposure apparatuses for the manufacture of semiconductor devices, a reticle on which an electronic circuit pattern is formed is illuminated with light from an illumination system, and the pattern is projected and transferred to the surface of a wafer through a projection optical system. To provide improved resolution, it may be a factor for illuminating the wafer surface uniformly.

In illumination systems for such projection exposure apparatus, various measures may be adopted to assure illumination of a surface, to be illuminated (such as a reticle surface or wafer surface), uniformly. As an example, a projection exposure apparatus called a stepper may use an illumination system having a combination of an optical integrator, comprising small lenses arrayed two-dimensionally at a predetermined pitch, with a collimator lens, to illuminate the surface uniformly.

With the use of such an optical integrator in an illumination system, a plurality of secondary light sources corresponding to the number of small lenses are defined, and the surface to be illuminated is illuminated with lights from the secondary light sources, with these lights being superposed one upon another by means of the collimator lens. This is effective to provide a uniform illuminance distribution upon the surface to be illuminated, such as a mask surface or reticle surface.

Generally, non-uniformness of illuminance distribution on a surface to be illuminated, when the illuminance non-uniformness is S, the maximum of illuminance level upon the surface to be illuminated is Smax, and the minimum of it is Smin, is expressed as follows:

S=(Smax−Smin)/(Smax+Smin).

Generally, in conventional projection exposure apparatuses, such non-uniformness of illuminance upon a surface to be illuminated is kept not greater than a few percent.

Another example is a method used in recent projection exposure apparatuses that distortion of a condenser lens is adjusted to correct a uniform illuminance distribution on a surface to be illuminated. Further, Japanese Laid-Open Patent Application, Laid-Open No. 42821/1989 proposes the use of light blocking members disposed at light entrance surfaces of some of small lenses, constituting an optical integrator, for blocking light impinging on these small lenses, to provide a uniform illuminance distribution on a surface to be illuminated.

The manufacture of semiconductor devices of large integration such as recent VLSIs, for example, requires very high uniformness of illuminance in circuit pattern printing.

It is known that, when the numerical aperture of a projection optical system of a projection exposure apparatus is NA and a wavelength used is $\lambda$, the resolution RP and the depth of focus DOF can be expressed by the following equations:

$$RP = k1(\lambda/NA) \quad (1)$$

$$DOF = k2(\lambda/NA^2) \quad (2)$$

where k1 and k2 are constants corresponding to a process, for example. In conventional illumination methods, when the numerical aperture of a projection optical system is $NA_{po}$ and the numerical aperture of an illumination optical system is $NA_{il}$, the following parameter is an index of resolution:

$$\sigma = NA_{il}/NA_{po}. \quad (3)$$

Conventionally, this $\sigma$ value is fixed to be about 0.5, and illuminance non-uniformness is reduced at this $\sigma$ value, whereby desired resolution is obtained.

However, in the manufacture of recent VLSIs, a further improvement of resolution is required for projection exposure apparatuses.

It is seen from equations (1) and (2) that, for an increase of resolution RP, $\lambda$ may be made smaller (shorter) and the numerical aperture $NA_{po}$ of the projection optical system may be made larger. However, it leads to a decrease of depth of focus DOF For balancing of these contradictory factors, ultra-resolution imaging methods, called a grazing incidence illumination method or a phase shift mask method, have been proposed. In such an illumination method or phase shift method, an aperture stop of an illumination optical system is changed to make the $\sigma$ value smaller, or secondary light sources of a peculiar shape such as a ring-zone like shape or quadruple-pole shape, for example, are used.

For such illumination methods, in many projection exposure apparatuses, positions of various components of an illumination system are adjusted so that the illuminance non-uniformness becomes smallest in a certain standard illumination mode (illumination mode A). However, if the illumination mode is changed to another illumination mode (illumination mode B) of a small $\sigma$ value, based on the grazing incidence illumination method or a phase shift method, for example, sufficient reduction of illuminance non-uniformness is not always attainable with the same structure or disposition of the components of the illumination system.

Further, in a projection exposure apparatus, there are cases where flare occurs due to reflection among a wafer surface, a reticle surface, a projection optical system and an illumination optical system, which may cause a non-uniform illuminance distribution on the surface to be illuminated. The amount of such flare changes with the transmission factor of a reticle or a reflection factor of a wafer. It is difficult in conventional projection exposure apparatuses to correct a non-uniform illuminance distribution due to flare to provide a uniform illuminance distribution.

SUMMARY OF THE INVENTION

It is an object of the present invention to provide an improved projection exposure apparatus and/or device manufacturing method by which the illuminance distribution can be adjusted.

In accordance with an aspect of the present invention, there is provided a projection exposure apparatus, comprising: an illumination optical system for illuminating an original with light from a light source; and a projection optical system for projecting a pattern of the original, illuminated with the light, onto a substrate to be exposed; wherein said illumination optical system includes an optical integrator having a plurality of lenses, and a movable member disposed at a light entrance side of said optical integrator and being movable in a direction intersecting an optical axis, said movable member having light quantity adjusting means for blocking a portion of light directed to a lens of said plurality of lenses to thereby change a light quantity distribution.

The direction intersecting the optical axis may be a direction perpendicular to the optical axis.

The movable member may be movable also in a direction of the optical axis.

The movable member may include a plurality of light quantity adjusting means each of which is provided in relation with an associated one of different lenses of said plurality of lenses.

In one preferred form of the present invention, the position of the movable member with respect to the direction perpendicular to the optical axis is changed to correct asymmetry of an illuminance distribution, with respect to the optical axis, upon a mask, a reticle or a wafer. The position of the movable member with respect to the optical axis direction may be changed to correct an illuminance difference, upon a mask, a reticle or a wafer, between a region close to the optical axis and a region remote from the optical axis. These corrections may be performed on the basis of a measurement of an illuminance distribution on the mask, the reticle or the wafer. The measurement and correction may be made once or plural times until a desired illuminance distribution is provided. Once the position of the movable member with respect to the optical axis direction and the position thereof with respect to the direction perpendicular to the optical axis, with which a desired illuminance distribution can be provided on the mask, the reticle or the wafer, are determined, the position of the movable member with respect to the optical axis direction and the position thereof with respect to the direction perpendicular to the optical axis may conveniently be memorized into memory means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 9A, 9B, 9C and 9D are schematic views, respectively, for explaining the procedure of illuminance non-uniformness correction as an ND filter in FIG. 1 is moved along the optical axis.

DESCRIPTION OF THE PREFERRED EMBODIMENTS

Figure 1:
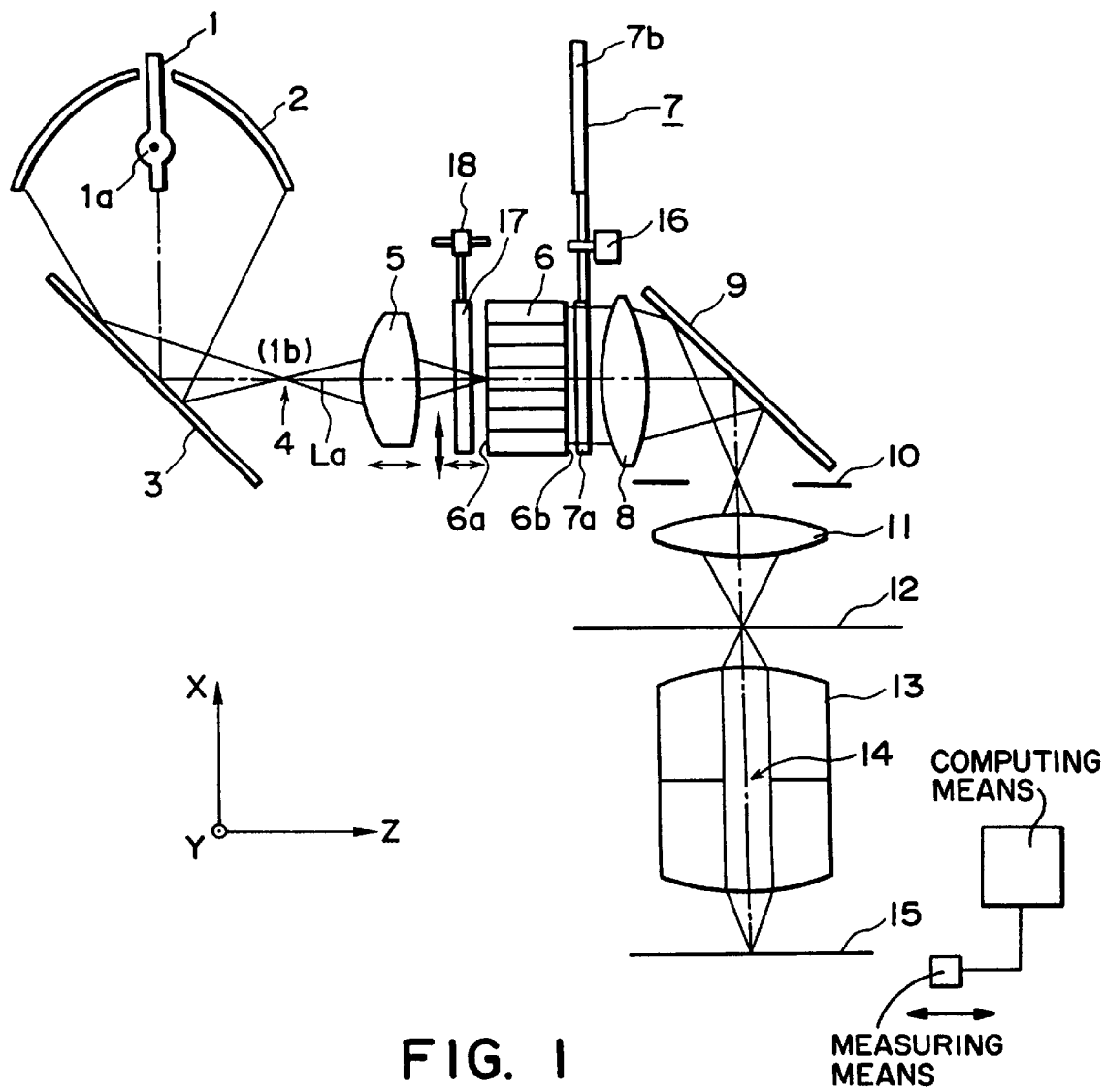
FIG. 1 is a schematic view of a main portion of a projection exposure apparatus according to a first embodiment of the present invention.

FIG. 1 is a schematic view of a main portion of a first embodiment of the present invention. In this embodiment, the invention is applied to a projection exposure apparatus of a step-and-repeat type or step-and-scan type, for lithography with a resolution of submicron or quarter-micron order or higher.

Denoted in the drawing at 2 is an elliptical mirror, and denoted at 1 is a light source which comprises a light emitting tube. It has a high luminance light emission point 1a for providing ultraviolet rays or deep ultraviolet rays. The light emitting point 1a is disposed at a first focal point of the elliptical mirror 2 or in the neighborhood thereof. Denoted at 3 is a cold mirror having a multilayered film, for transmitting most of infrared light and for reflecting most of ultraviolet light. The elliptical mirror 2 serves to form an image (light source image) 1b of the light emitting point 1a at a second focal point thereof or in the neighborhood thereof, through cooperation with the cold mirror 3.

Denoted at 5 is an optical system which comprises a condenser lens, a collimator lens and/or a zoom lens, for example. It serves to image the light source image 1b, formed at or adjacent to the second focal point, on a light entrance surface 6a of an optical integrator 6 in association with light from a quantity controlling member (light quantity control means) 17 which restricts the quantity of light to be passed therethrough. The optical integrator 6 comprises a plurality of small lenses (fly's eye lenses) $6_i$ (i=1 to N) having a rectangular sectional shape which are arrayed two-dimensionally with a predetermined pitch, along a direction intersecting the optical axis La. It serves to produce secondary light sources in the neighborhood of a light exit surface 6b thereof.

The light quantity controlling member 17 is disposed adjacent to the light entrance surface 6a of the optical integrator 6, and it is movable along a plane (X-Y plane) perpendicular to the optical axis La of the optical system (illumination system) 5, as well as in the direction of optical axis La and in a direction tilted by a predetermined angle with respect to the optical axis La.

The light quantity controlling member 17 has a light quantity adjusting member which comprises an ND filter or a light blocking member, for example, for adjusting the quantity of light passing at least one of the small lenses of the optical integrator 6. Denoted at 18 is a driving mechanism which is operable in response to a signal from illuminance measuring means (not shown) for measuring illuminance upon a masking blade 10, a reticle 12 or a wafer 15, to move the light quantity control means 17 along the plane perpendicular to the optical axis La and in the optical axis La direction, or in a direction with tilt by a predetermined angle with respect to the optical axis La. With this operation, the illuminance distribution of the surface to be illuminated (such as the surface of the masking blade, of the mask, of the reticle or of the wafer) can be adjusted.

Denoted at 7 is a stop which functions to determine the shape and/or size of the secondary light source. The stop 7 has an interchangeable structure that, in accordance with an illumination condition, a stop changing mechanism (actuator) 16 selectively positions one of various stop members 7a and 7b on the path of light. Examples of these stop members are a stop with an ordinary circular aperture, a stop for quadruple-pole illumination, or a stop for small σ value illumination (usually with a circular opening). One of these stops is selected and placed on the light path.

In this embodiment, in accordance with the size or shape of a pattern of a mask or reticle, that is, in accordance with the type of a mark or reticle used, various stop members 7a and 7b are selectively used to change the light impinging of a condenser lens 8, to thereby suitably control the light intensity distribution on a pupil plane 14 of the projection optical system 13. The condenser lens 8 serves to collect lights, emitted from the secondary light sources adjacent to the light exit surface 6b of the optical integrator 6 and passing through the stop 7. The collected lights are reflected by a mirror 9 and they are superposed one upon another on the surface of a masking blade 10 which is a surface to be illuminated, such that the surface of the masking blade 10 is illuminated uniformly. The masking blade 10 comprises a plurality of movable plates which are movable to define a desired aperture shape. As a result of the structure described above, the surface of the reticle or mask 12 and the surface of the wafer 15 can be illuminated (exposed) uniformly.

Denoted at 11 is an imaging lens for transferring the aperture (its shape) of the masking blade 10 onto the surface of the mask or reticle 12 which is the surface to be illuminated, whereby a required region on the mask surface or reticle surface 12 is illuminated uniformly.

Denoted at 13 is a projection optical system (projection lens) for projecting, in a reduced scale, a circuit pattern of the mask or reticle 12 onto the surface of the wafer 15 placed on a wafer chuck. Denoted at 14 is a pupil plane of the projection optical system 13.

In the optical system of this embodiment, the light emitting point 1a, the second focal point 4, tile light entrance surface 6a of the optical integrator 6, the masking blade 10, the reticle or mask 12, and the wafer 15 are disposed in a mutually optically conjugate relationship. Also, the stop 7a and the pupil plane 14 are in an approximately optically conjugate relation with each other.

With the structure of the present embodiment as described above, the pattern of the mask or reticle 12 is reduction-projected and printed on the wafer 15 surface. Then, a predetermined development process is carried out, and finally a device (semiconductor device) is produced.

In this embodiment, as disclosed in Japanese Laid-Open Patent Application, Laid-Open No. 47626/1993 or Laid-Open No. 47640/1993, stops having different aperture shapes are selectively used in accordance with the shape of a pattern of the reticle 12, to change the light intensity distribution to be defined on the pupil plane 14 of the projection optical system 13, in various ways.

Next, an optical function of the light quantity control means 17 of this embodiment will be described.

Figure 2A:
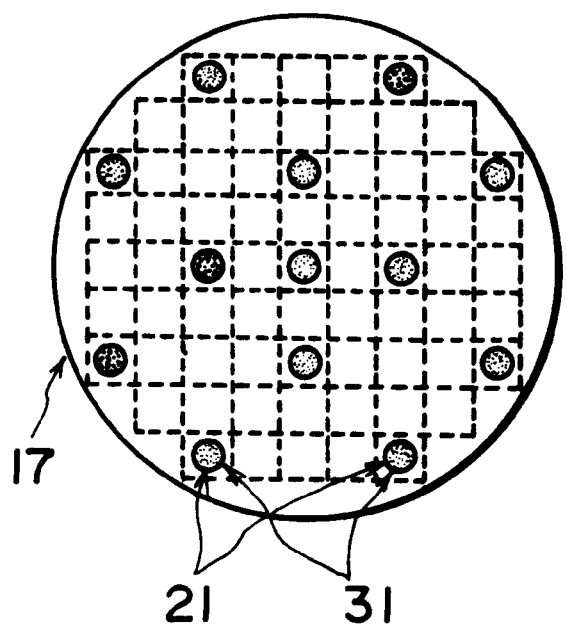
FIGS. 2A and 2B are schematic views for explaining the positional relation of an ND filter and an optical integrator, in the embodiment of FIG. 1.
Figure 2B:
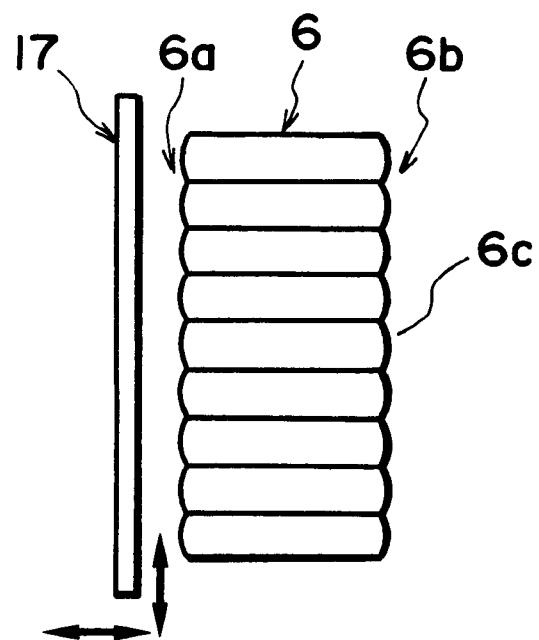

FIG. 2A is a schematic view of the light quantity controlling member 17, as seen from the light entrance side thereof. It comprises an optical filter having light adjusting portions 21 which are provided by ND filters or light blocking members. FIG. 2B is a side view of a main portion of the light quantity controlling member (optical filter) 17 and the optical integrator 6.

The optical filter 17 of FIG. 2A has light quantity adjusting portions 21 which are operationally associated with desired ones of plural small lenses 6c of the optical integrator 6 (in the drawing, sixty-nine small lenses as depicted by broken lines) to adjust the quantity of light passing them. In FIG. 2A, there are thirteen light quantity adjusting portions 21 which are operationally associated with thirteen lenses of the small lenses of the optical integrator, and which comprise thirteen ND filters of circular shape for reducing the quantity of light entering the associated lenses.

ND filters or light blocking members used in this embodiment may be made generally by providing a dielectric multilayered film or a metal film such as Cr on a glass substrate by deposition or, alternatively, by coloring a substrate itself with pigment, to produce a desired transmission factor. Other optical elements having a similar optical property as that of the ND filter may be used.

In FIG. 2B, denoted at 6c are small lenses which constitute the optical integrator 6. The lens surfaces 6a of the small lenses 6c have a rear focal point which is at the position of the light exit side lens surfaces 6b. Further, the front focal point of the light entrance side lens surfaces 6b of the small lenses 6c is at the position of the light entrance side lens surfaces 6a. As a result, the light collected on the lenses surface 6a of the small lens 6c by means of the optical system 5 emerges from the lens surfaces 6b in the form of parallel light. These parallel lights emitted from the lens surfaces 6b go through the stop 7a and, after being collected by the condenser lens 8, they are reflected by the mirror 9 and collected on the masking blade 10. In this manner, the light entrance surfaces 6a of the optical integrator 6 and the masking blade 10 (the surface to be illuminated) are placed in an optically conjugate relation.

Figure 3A:
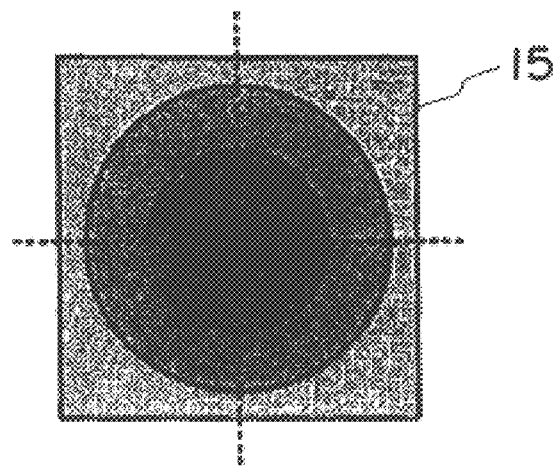
FIGS. 3A, 3B and 3C are schematic views, respectively, for explaining an example of a changing characteristic of an illuminance distribution on a surface to be illuminated, in the first embodiment of FIG. 1.
Figure 3B:
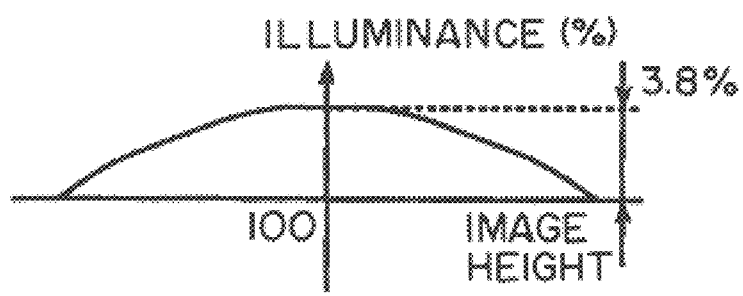
Figure 3C:
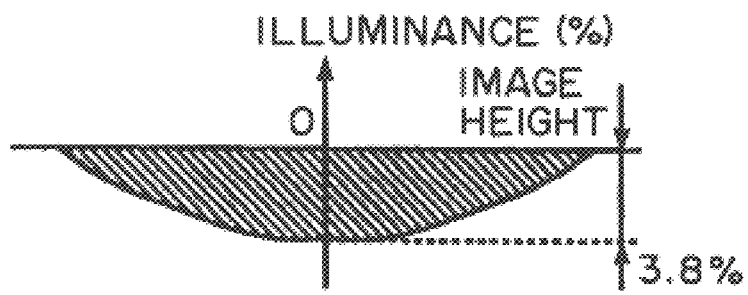

In this embodiment, the illuminance distribution formed on the surface 10 to be illuminated results from superposition of illuminance distributions at the light entrance surfaces of the small lenses 6c. As long as the system is symmetrical with respect to the optical axis La, no illuminance uniformness is produced. Practically, however, due to flare or eccentricity of the lens system or to the coating characteristic of the lenses, illuminance non-uniformness is produced on the surface 10 illuminated. FIGS. 3A–3C show an example of illuminance non-uniformness produced upon the wafer 15 surface.

Next, basic correction of illuminance non-uniformness in this embodiment will be explained. In a case wherein an ordinary illumination method is used, there may occur illuminance non-uniformness which may be such as shown in FIG. 3A as viewed two-dimensionally arid as shown in FIG. 3B as viewed in section with respect to image height.

It is now assumed that in FIG. 3B there is an illuminance distribution difference of 3.8% between on-axis and peripheral portions, and that the number of small lenses constituting the optical integrator 6 is sixty-nine (69) as shown in FIG. 2A. In this case, the light quantity adjusting means 21 may comprise thirteen ND filters of circular shape for reducing the transmission light quantity to 80%, to correct the illuminance non-uniformness.

The intensity of light passed through this circular portion is decreased. Idealistically, there occurs a decrease of illuminance upon a plane which is optically conjugate with the transmission factor adjusting means, as follows:

$$\{13\times[1-(80/100)]/69\}\times 100 \approx 3.8(\%)$$

Here, the optical filter 17 is disposed at a predetermined distance D from the light entrance surface 6a of the optical integrator 6. With an increase of distance D, the boundary between the illuminance-decreased portion (decreased by the ND filter or light blocking member) and the portion not illuminance-decreased becomes vague. Thus, the sectional shape of the illuminance distribution change upon the surface to be illuminated (i.e., the wafer 15 surface) is not rectangular, but it may be a slow illuminance decrease having a gentle shape, as depicted by hatching in FIG. 3C, for example.

Since, in this embodiment, the light quantily of the small lenses is adjusted symmetrically with respect to the optical axis La, there occurs substantially no deviation of telecentricity degree. By appropriately determining the shape, size, or transmission factor of the light quantity adjusting members (ND filters or light blocking members) as well as the distance D thereof, as described above, a uniform illuminance distribution is provided over the whole range of the surface 10 to be illuminated.

In this embodiment as described, with respect to at least one lens of the small lens group of the optical integrator 6, the quantity of light impinging on the light entrance surface 6a, which is optically conjugate with the surface 10 to be illuminated, is adjusted. It is now assumed that the number of light quantity adjusting members 21 is n, the transmission factor is T, the number of small lenses constituting the optical integrator 6 is N, and the illuminance on the surface to be illuminated is W. At the portions of light quantity adjusting members 21 of the light quantity control means 17, light of (1−T)*n does not reach the surface to be illuminated. Thus, on the surface to be illuminated, in those regions substantially corresponding to the shape of the ND filters or light blocking members of the light quantity control means 17, there occurs a small decrease of illuminance such as follows:

$$W*n*(1-T)/N.$$

Figure 4A:
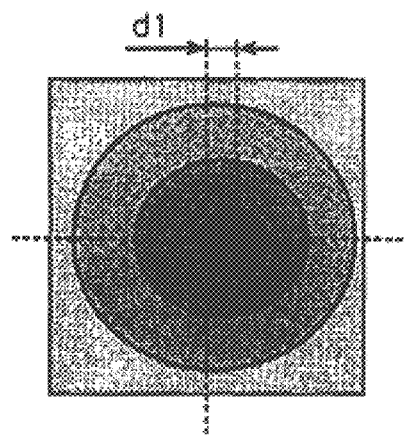
FIGS. 4A, 4B, 4C and 4D are schematic views, respectively, for explaining an example of a changing characteristic of an illuminance distribution on a surface to be illuminated, when in the first embodiment of FIG. 1 the ring-zone illumination is used.
Figure 4B:
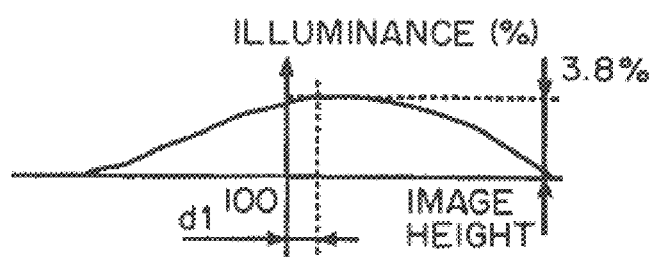

On the other hand, in a case wherein ring-like zone illumination, for example, is performed, there will occur illuminance non-uniformness such as shown in FIG. 4A as viewed two-dimensionally or as shown in FIG. 4B as viewed in section with respect to image height. The manner of correction of such illuminance non-uniformness will be described below.

Figure 5:
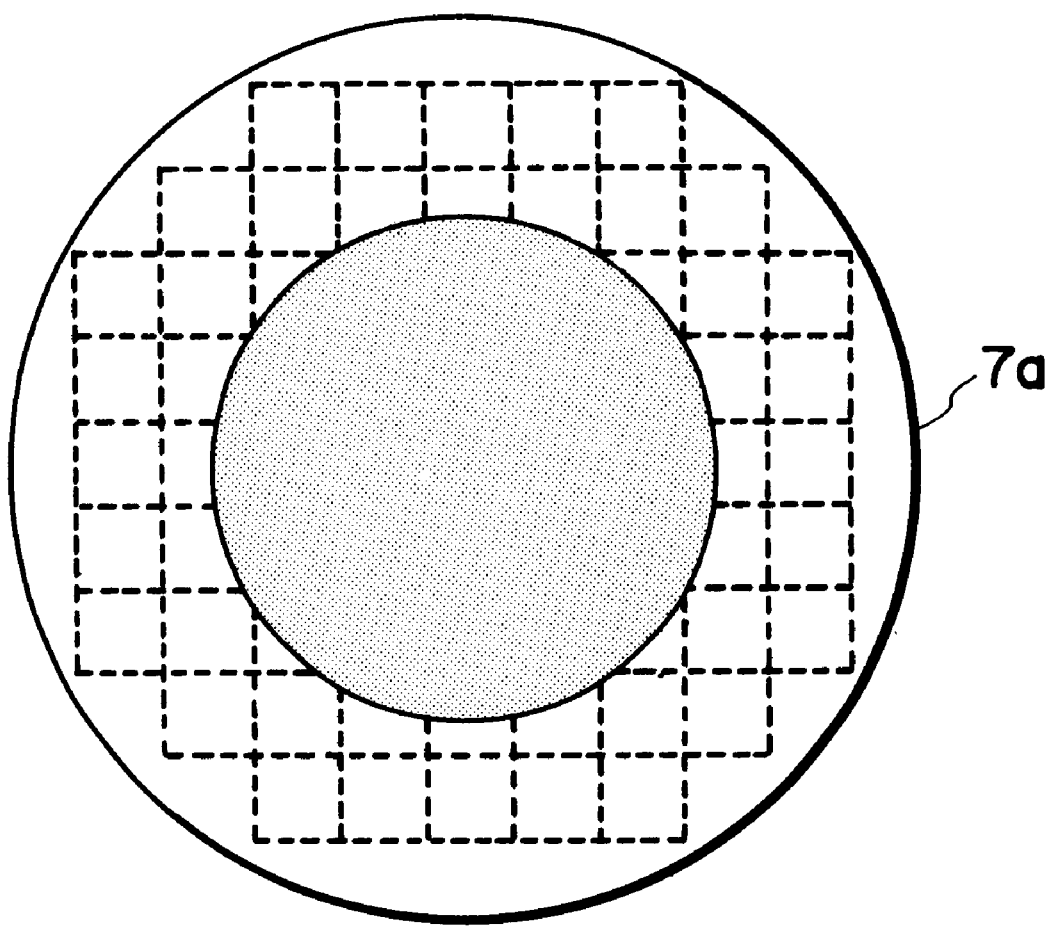
FIG. 5 is a schematic view for explaining an example of light interception at a stop 7 in ring-zone illumination, in the embodiment of FIG. 1.

In FIGS. 4A and 4E, for example, while the illuminance in the neighborhood of the on-axis portion may be high as in the case of ordinary illumination, the highest peak is deviated from the optical axis by a distance d1. There may be an illuminance difference of 3.8% between the illuminance at this peak portion and the peripheral low-illuminance portion. The circular region of the optical integrator 6 to be eclipsed by the stop 7a for ring-like zone illumination may be such as shown in FIG. 5, and the number of those of the small lenses of the optical integrator 6 to be used for the illumination may be forty-two (42) as converted.

Under the conditions described above, the light quantity controlling member 17 may be used to correct the illuminance non-uniformness in the following manner. Idealistically, the amount of illuminance correction as the light quantity controlling member 17 is used in this ring-like zone illumination is:

$$\{8\times[1-(80/100)]/42\}\times 100 = 3.8(\%).$$

Figure 4C:
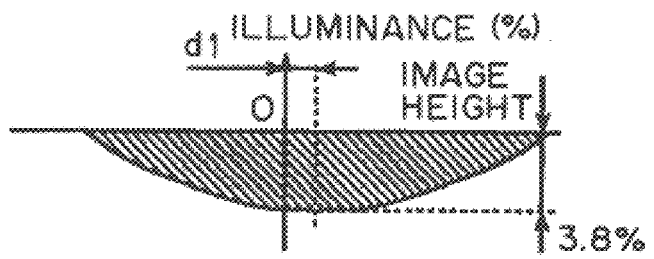
Figure 4D:
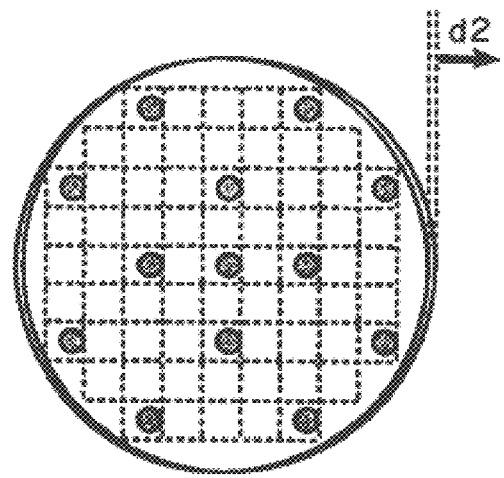

Here, the light quantity controlling member 17 is moved by means of the driving mechanism, along the light entrance surface of the optical integrator 6 and in a direction perpendicular to the optical axis, by a distance d2 corresponding to the distance di on the surface 10 to be illuminated (FIG. 4D). As a result, the illuminance distribution change on the surface 10 illuminated is such as shown in FIG. 4C, wherein it is deviated from the optical axis. Thus, illuminance non-uniformness such as shown in FIG. 4A or 4B can be effectively corrected.

Figure 6:
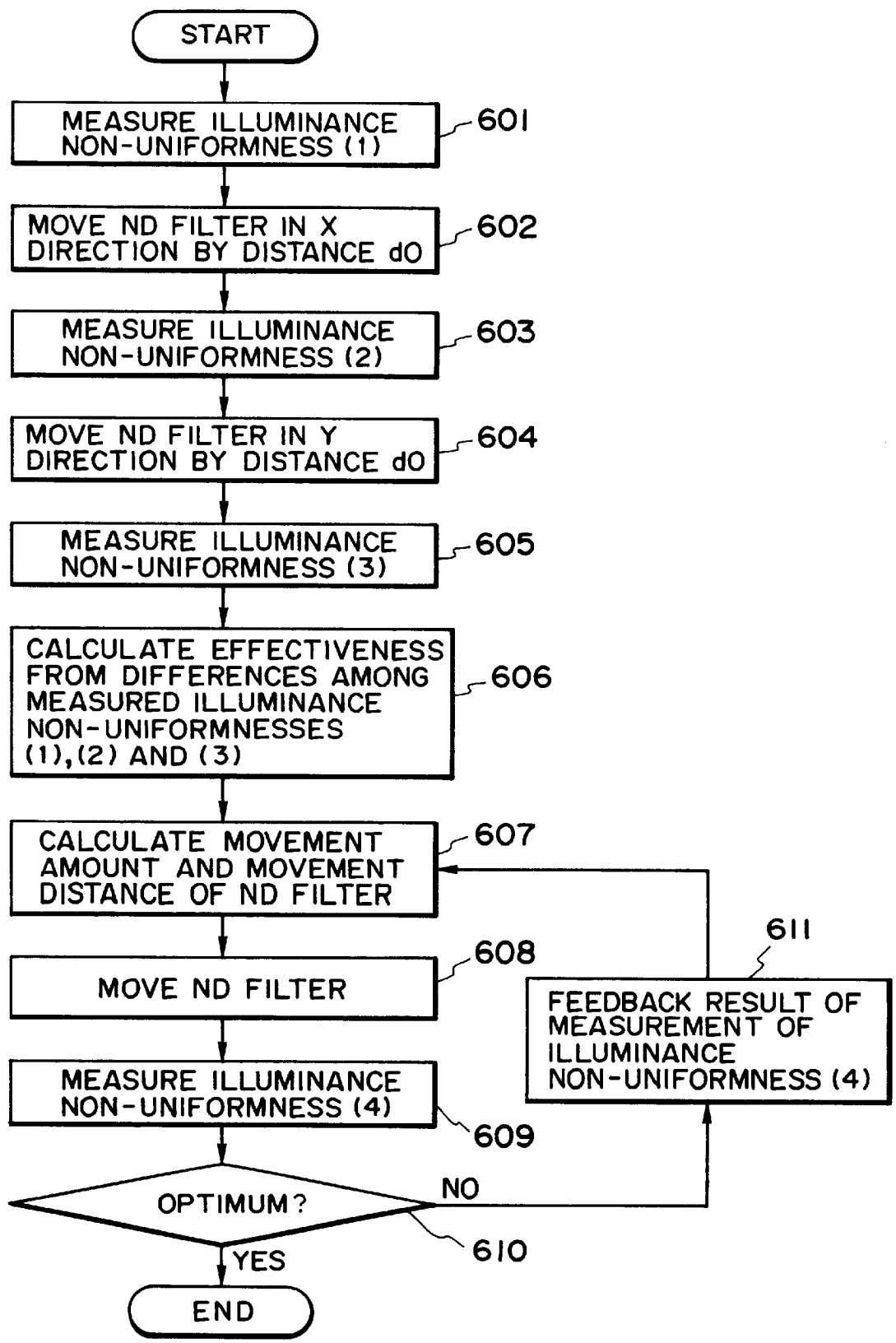
FIG. 6 is a flow chart for explaining the procedure of illuminance non-uniformness correction as an ND filter in FIG. 1 is moved along a plane perpendicular to the optical axis.
Figure 7A:
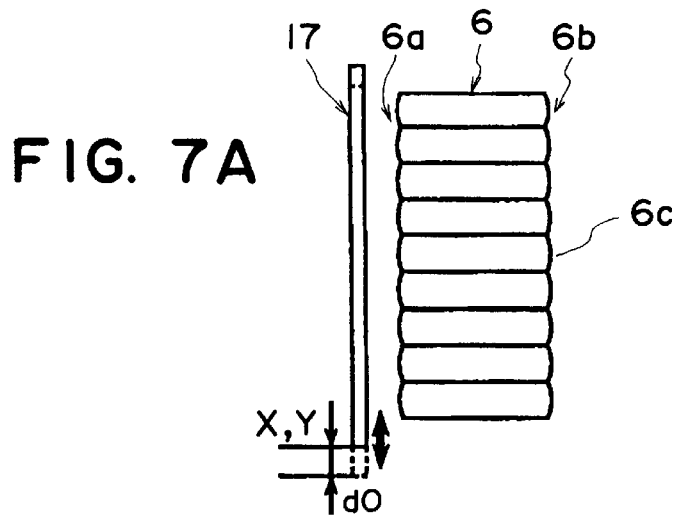
FIGS. 7A, 7E, 7C and 7D are schematic views, respectively, for explaining the procedure of illuminance non-uniformness correction as an ND filter in FIG. 1 is moved along a plane perpendicular to the optical axis.

The flow chart of FIG. 6 illustrates the procedure of correcting illuminance non-uniformness which is asymmetrical with respect to the optical axis, in this embodiment. FIG. 7A shows the direction of movement of the light quantity controlling member 17.

Figure 7B:
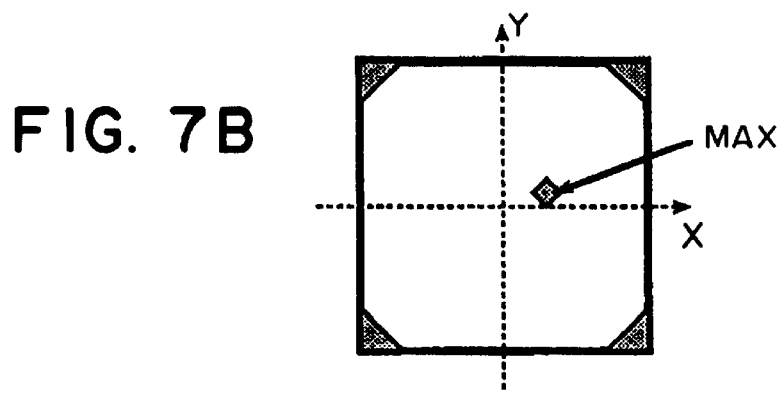

The position coordinates of such a point that represents the largest illuminance upon the surface 10 to be illuminated as well as the illuminance at four points in the outermost peripheral portion are measured beforehand, and the results are used as basic data (see hatched regions in FIG. 7B). As shown in FIG. 7A, the X coordinate and Y coordinate are taken along a plane perpendicular to the optical axis. The light quantity controlling member 17 is moved in the X direction and Y direction by a predetermined amount d0, and illuminance non-uniformness is measured. Then, the amounts of changes in illuminance at the largest illuminance position coordinates as well as at the four points in the outermost peripheral portion of the picture field are calculated by means of a computing device (not shown) of the projection exposure apparatus. Then, the efficiency (amount of influence) for the amount of change as the light quantity controlling member 17 is moved is stored into memory means (not shown) of the projection exposure apparatus. Then, on the basis of this efficiency, the movement direction and movement amount for moving the light quantity controlling member 17 are calculated by use of computing means (not shown) of the apparatus.

Figure 7C:
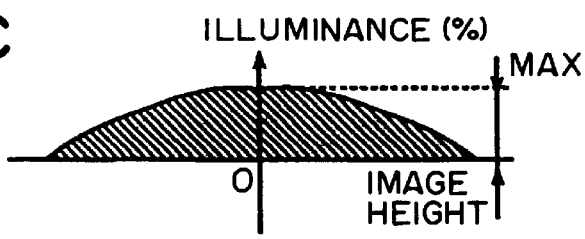
Figure 7D:
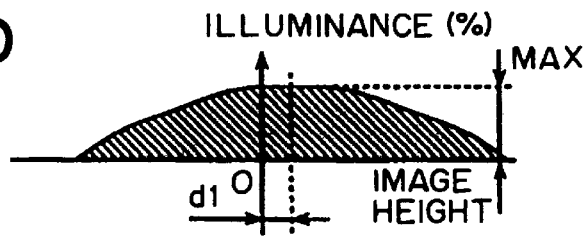

On the basis of the result of calculation, the driving means 18 is used to move the light quantity controlling member 17 in a predetermined direction. After movement, illuminance non-uniformness is measured again and, if an optimum value is reached, the operation is completed. If further correction is necessary, the above-described procedure is repeated to correct asymmetrical illuminance non-uniformness into a good state. FIGS. 7C and 7D show an example of changing the illuminance non-uniformness correction range in the procedure described above.

The correction method described with reference to asymmetric illuminance non-uniformness is not limited to asymmetric illuminance non-uniformness resulting from changing the illumination mode to ring-like zone illumination mode. It is applicable similarly to asymmetric illuminance non-uniformness which is caused in ordinary illumination methods.

An adjusting method for a case wherein an illuminance correction amount differs between different illumination modes may be such that: the distance D between the ND filter or light blocking member of the light quantity controlling means 17 and the light entrance surface 6a of the optical integrator 6 is made larger, to thereby reduce the rate of illuminance decrease on the surface 10 to be illuminated. When the distance D between the ND filter or light blocking member and the light entrance surface 6a of the optical integrator 6 is enlarged, the shadow of the ND filter or light blocking member on the surface to be illuminated is blurred. Based on this, the magnitude of illuminance adjusting range can be adjusted.

Figure 8:
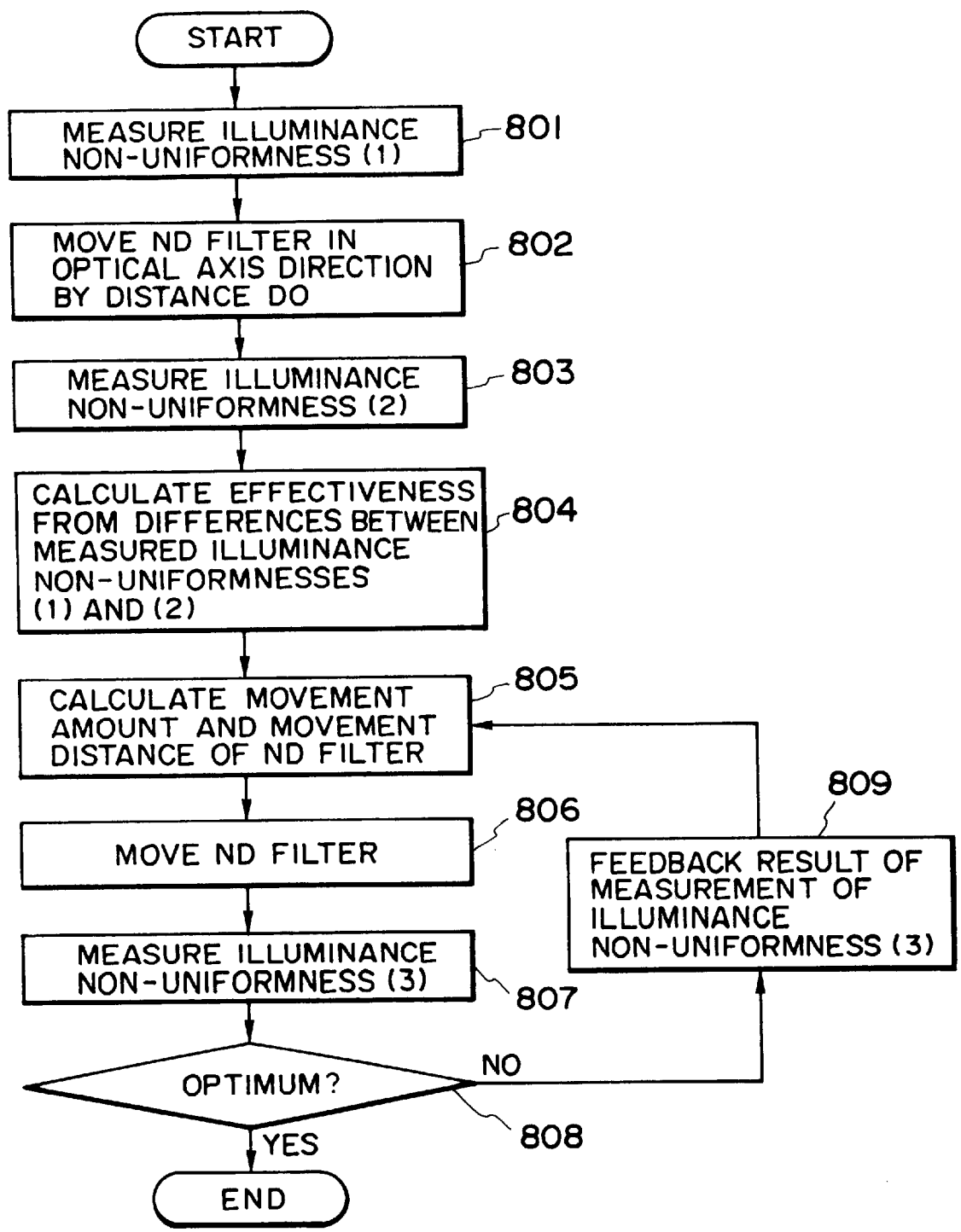
FIG. 8 is a flow chart for explaining the procedure of illuminance non-uniformness correction as an ND filter in FIG. 1 is moved along the optical axis.

The flow chart of FIG. 8 illustrates the procedure for changing the light quantity adjusting range in this embodiment. FIG. 9A shows the movement direction of the light quantity controlling member 17.

Illuminance at four points in the outermost peripheral portion of the surface 10 to be illuminated as well as illuminance at four 50% points from the center to the outermost peripheral portions are measured beforehand, and the results are used as basic data (see hatched regions in FIG. 9B).

The light quantity controlling member 17 is moved along the optical axis direction by a predetermined distance D0, and illuminance non-uniformness is measured. The amounts of changes in illuminance at the four points in the outermost peripheral portion of the surface to be illuminated, as well as the amounts of changes in illuminance at the four 50% distance points from the center to the outermost peripheral portion are calculated by use of computing means (not shown) of the projection exposure apparatus. Then, the efficiency (amount of influence) as the light quantity controlling means 17 is moved is memorized into memory means of the apparatus. Based on this efficiency, the movement direction and movement amount for moving the light quantity controlling means 17, along the optical axis, are calculated by use of computing means of the projection exposure apparatus. If the range of illuminance correction is to be enlarged, the distance D may be enlarged. If the range is to be reduced, the distance D may be reduced.

On the basis of the result of the calculation, the driving mechanism 18 is used to move the light quantity controlling member in a predetermined direction by a predetermined amount, whereby adjustment of illuminance distribution is performed in a certain range of the surface to be illuminated. After movement illuminance non-uniformness is measured again and, if an optimum value is reached, the operation is completed. If further correction is necessary, the above-described procedure is repeated to correct illuminance non-uniformness into a good state. FIGS. 9C and 9D show an example of changing the illuminance non-uniformness correction range in the procedure described above.

Although a description has been made with respect to both an example where the movement direction of the light quantity controlling member 17 is along a plane perpendicular to the optical axis and an example where it is along the optical axis direction, these corrections may be performed simultaneously or sequentially, and it enables fine correction. On that occasion, the procedures shown in the flow charts of FIGS. 6 and 8 may be done in series or in parallel.

Figure 14:
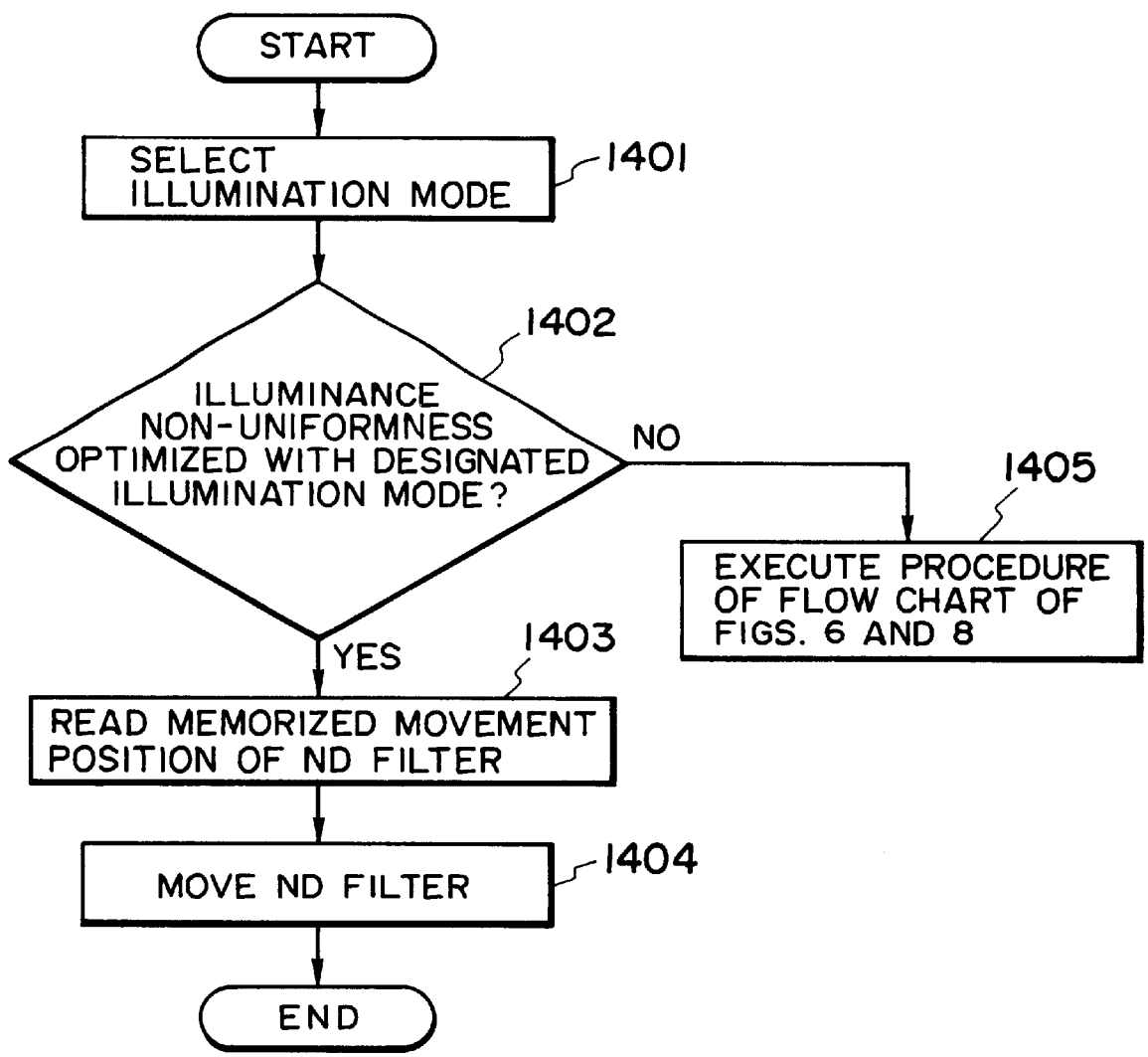
FIG. 14 is a flow chart for explaining a procedure according to the first embodiment of the present invention.

Further, although a description has been made with reference to FIGS. 6 and 8 to explain procedures for optimizing illuminance non-uniformness, a mechanism (not shown) for detecting the position of the light quantity controlling member may be provided so that the position of the light quantity controlling member with which the illuminance non-uniformness is optimized may be memorized into memory means (not shown) of the projection exposure apparatus, in relation to each of different illumination modes (different stops). If an illumination mode for which optimization of illuminance non-uniformness has already been performed is selected, the position of the light quantity controlling member having been stored in the memory means is read out. Then, the light quantity controlling member is moved to that position, in the optical axis direction or in a direction perpendicular to the optical axis. This enables prompt correction of illuminance non-uniformness, without the procedure shown in FIG. 6 or 8. The flow chart of FIG. 14 shows the procedure according to this example.

While the foregoing description has been made with reference to examples wherein there is a difference in illuminance non-uniformness between an ordinary illumination mode and a ring-like zone illumination mode, a large number of light quantity adjusting members such as ND filters may be provided such as shown in FIG. 2 or 10 with optimization of the transmission factor thereof. Then, not only for the ordinary illumination mode and ring-like zone illumination mode but also for other illumination conditions of a small σ value as used in quadruple pole illumination or phase shift mask illumination, similar advantageous results are attainable.

When a large number of light quantity adjusting members are used, for minimization of deviation of telecentricity level, the light quantity adjusting members may preferably be disposed revolutionally symmetrically with respect to the center or the optical axis and at four corners of a square shape. Further, those light quantity adjusting members which are at the same distance from the center may preferably have the same transmission factor.

In the illumination according to grazing incidence illumination or to small σ value illumination, as compared with ordinary illumination, the quantity of light from the optical integrator 6 decreases. This means that the illuminance contribution efficiency, upon the surface to be illuminated, per a single small lens of the optical integrator 6 is enlarged. For this reason, the transmission factor of the ND filter of the light quantity adjusting member should be determined carefully.

Figure 10A:
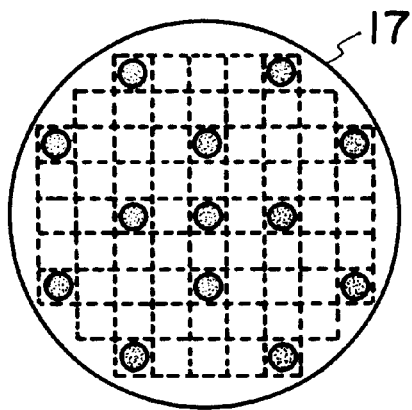
FIGS. 10A, 10B, 10C and 10D are schematic views, respectively, for explaining examples of ND filters usable in the present invention.
Figure 10B:
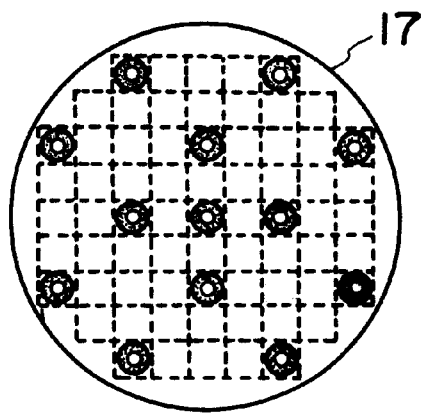
Figure 10C:
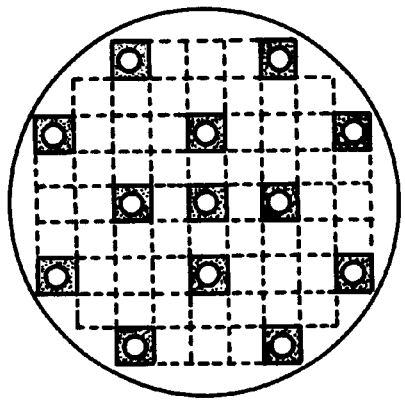
Figure 10D:
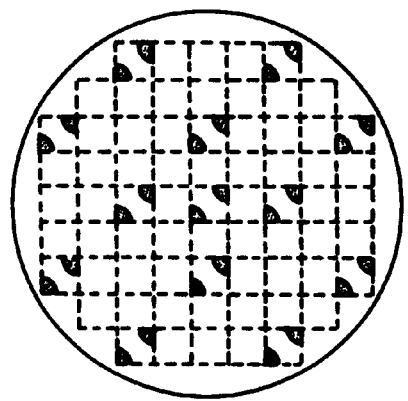

Next, the shape of light quantity controlling member will be explained. There may be various shapes for the light quantity controlling member, to meet the shapes of regions where illuminance distribution correction is required. FIG. 10A–10D show examples, like FIG. 2A. FIG. 10A shows an example wherein a circular light quantity controlling member is provided at the center of the light quantity controlling member. This shape will be suitable for correction of a hot spot to be defined at the center of the surface to be illuminated FIG. 10B shows an example wherein a ring-like light quantity adjusting member is formed on the light quantity controlling member 17. Such an adjusting member will be effective to correction to be made in a case where ring-like zones of the surface illuminated have higher illuminance. FIG. 10C shows an example wherein a light quantity adjusting member having a square shape with a central window of a size balanced with the size of the small lens, is provided. This will be effective to a case where the illuminance at the peripheral portion of the surface to be illuminated is high. FIG. 10D shows an example wherein light quantity adjusting members are provided at two corners along a diagonal of a square region. This will be effective to correct asymmetric illuminance non-uniformness. As described, the shape of the light quantity adjusting member can be optimized in accordance with the type of illuminance non-uniformness (i.e., illuminance distribution), and uniform illuminance can be provided on the surface to be illuminated.

Figure 11:
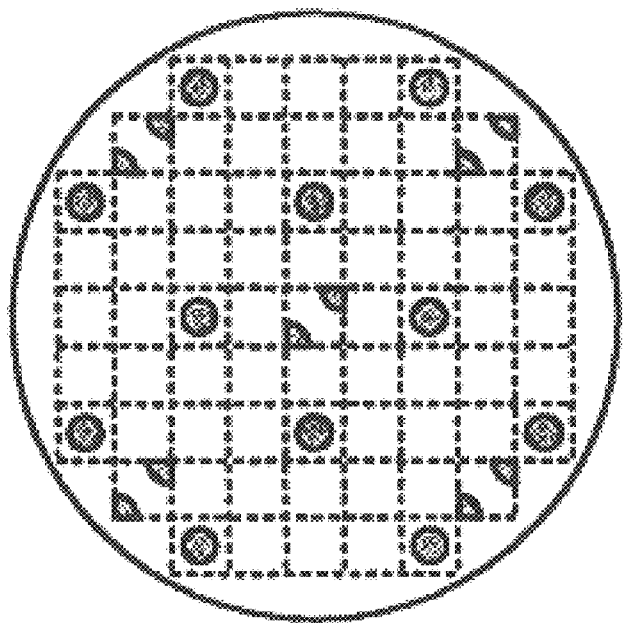
FIG. 11 is a schematic view for explaining an example of a combination of ND filters in FIGS. 10A–10D, and a correction shape.
Figure 11:
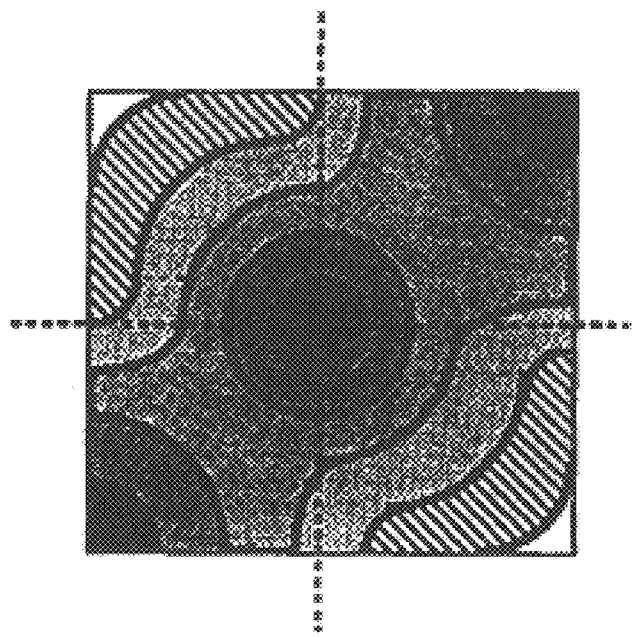

On an occasion wherein, on the surface to be illuminated, there is a distribution of different non-uniform illuminance which are different in shape of the illuminance distribution or different in illuminance itself, light quantity adjusting members to be used may have different shapes or different transmission factors. FIG. 11 shows an example wherein an optical filter (light quantity controlling means) 17 having a combination of those light quantity controlling members such as shown in FIGS. 10A and 10D is used, as well as the illuminance distribution to be corrected thereby, being illustrated two-dimensionally.

Figure 15A:
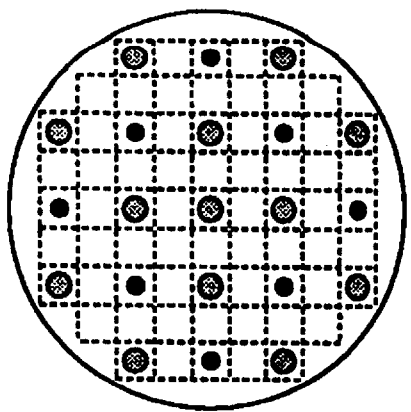
FIGS. 15A, 15B, 15C and 15D are schematic views, respectively, for explaining an ND filter and an optical integrator.
Figure 15B:
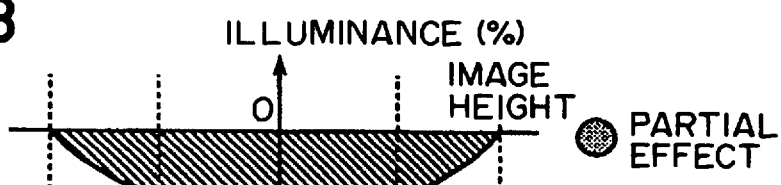
Figure 15C:
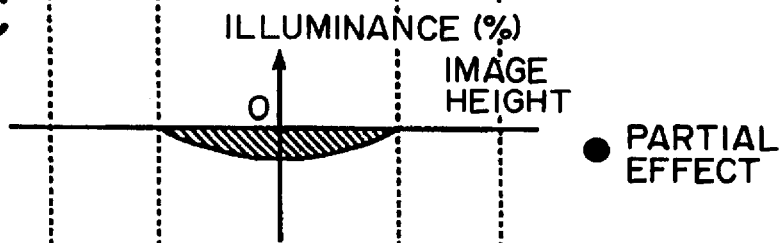
Figure 15D:
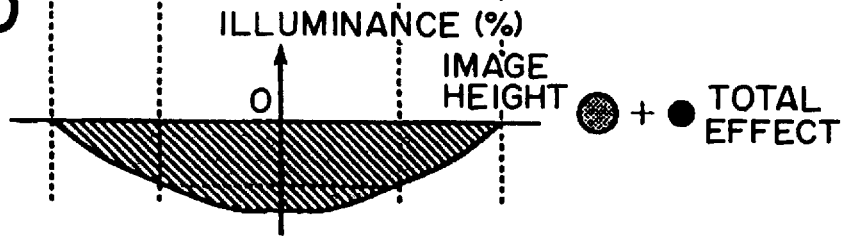

A further alternative will be described with reference to FIGS. 15A–15D. Light quantity adjusting members of circular shape having different sizes may be used, such as shown in FIG. 15A, to correct illuminance non-uniformness in which the illuminance decreases toward the periphery (FIG. 3B). On that occasion, with a suitable setting of the distance of the light quantity adjusting member from the light incidence surface 6a of the small lens of the optical integrator 6, the effects such as illustrated in FIGS. 15B and 15C are imparted to those portions of the controlling member, whereby correction is done with combined effects. By appropriately changing the diameter or transmission factor of each circular light quantity adjusting member (i.e., by changing the illuminance adjusting range or adjusting amount shown in FIG. 15B or 15C), not only the correction of an illuminance difference between the central portion and the peripheral portion of the surface to be illuminated but also the illuminance distribution over the whole of the surface to be illuminated, including an intermediate region between the central region and the outermost peripheral region, can be optimized. Further, in place of using light quantity adjusting members of different sizes, those light quantity adjusting members having different shapes may be used. Alternatively, they may have both different sizes and different shapes.

For the light quantity controlling member which may have various light quantity adjusting members such as shown in FIGS. 10A–10D or in FIG. 11, the driving mechanism 18 may be used to move the light quantity controlling member 17 along a plane perpendicular to the optical axis and/or along the optical axis. Then, optimum correction is assured for different illuminance or different illumination distributions in different illumination conditions or modes.

When such a light quantity controlling member is used, not the position representing the largest illuminance level of this member but rather the position representing the smallest illuminance level may be used as data, as in the flow chart of FIG. 6. Alternatively, use of the illuminance in the region of 50% image height of the maximum image height as data in the flow chart of FIG. 8 may be replaced by using the illuminance at 30% or 70% of the image height region as data. The correction procedure may be optimized in this manner.

Although the embodiments described above use a Hg lamp as a light source for producing an effective light source (zeroth order light source), an effective light source can be provided by using a coherent light source such as a laser, for example.

Next, an embodiment of a device manufacturing method which uses a projection exposure apparatus such as described above, will be explained.

Figure 12:
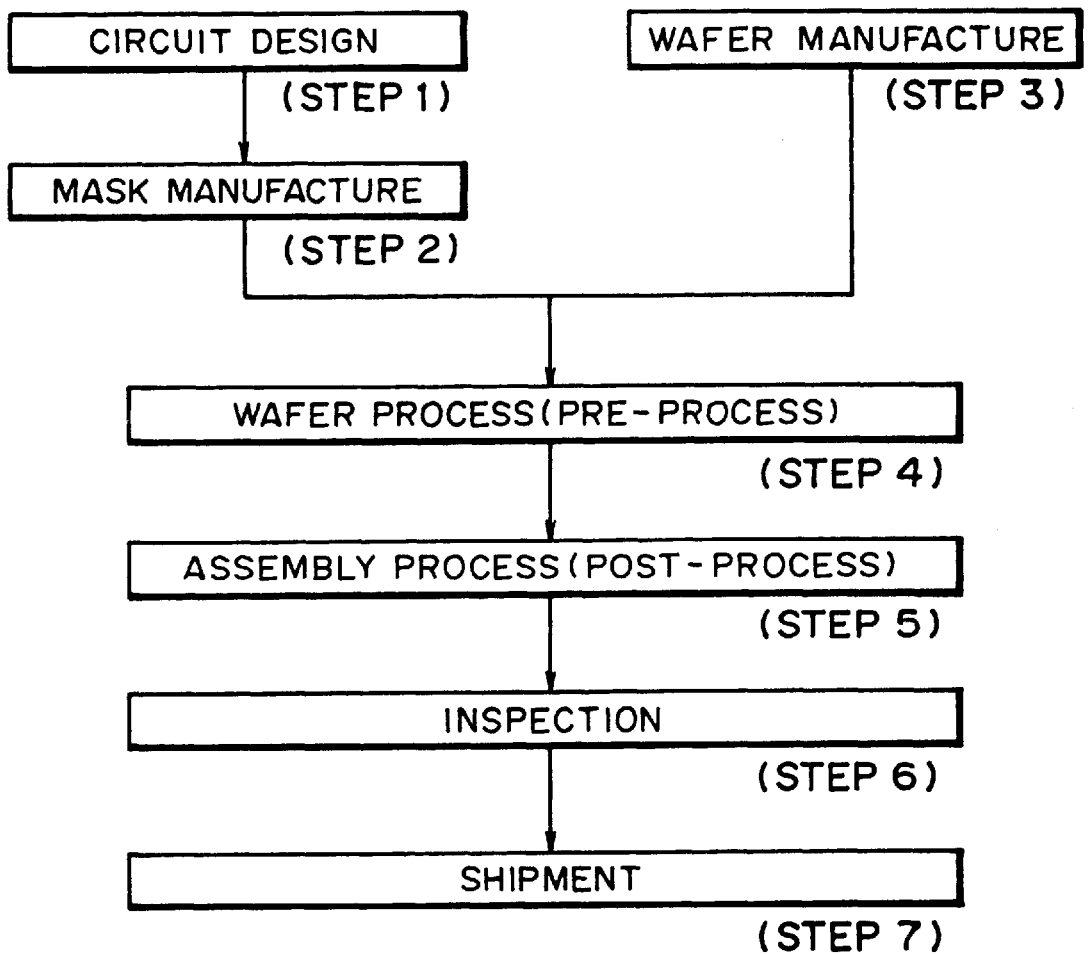
FIG. 12 is a flow chart of device manufacturing processes in accordance with the present invention.

FIG. 12 is a flow chart of a procedure for the manufacture of microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 13:
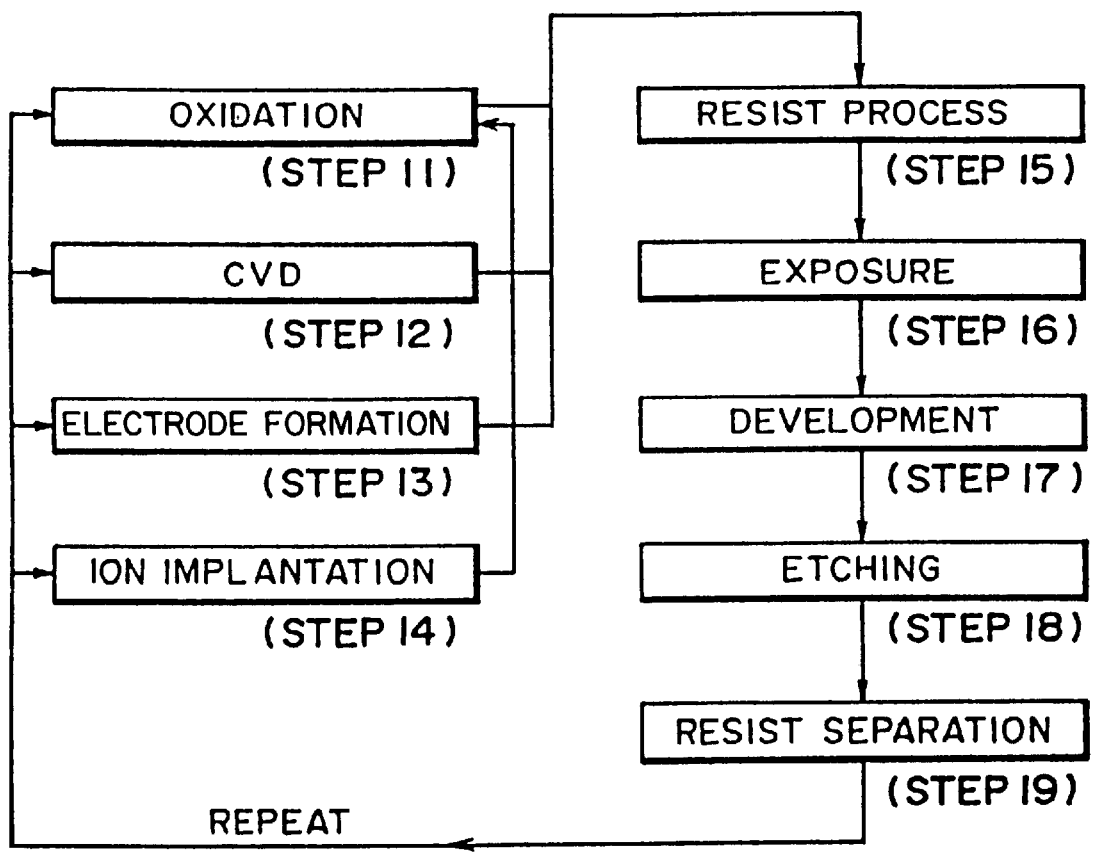
FIG. 13 is a flow chart of a wafer process, in the procedure of FIG. 12.

FIG. 13 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the water after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
an illumination optical system for illuminating an original with light from a light source, said illumination optical system including an optical integrator having a plurality of lenses, and a transparent substrate disposed juxtaposed to a light entrance surface of said optical integrator and having a light quantity adjusting film formed thereon for blocking a portion of light directed to at least one lens of said plurality of lenses, wherein said light quantity adjusting film includes at least one portion which is provided in relation to the at least one lens of said plurality of lenses, said transparent substrate being movable in a direction intersecting an optical axis to thereby change a light quantity distribution on a light entrance surface of the at least one lens so as to change an illuminance distribution on a plane to be illuminated; and a projection optical system for projecting a pattern of the original, illuminated with the light, onto a substrate to be exposed.

2. An apparatus according to claim 1, wherein the original is a mask.

3. An apparatus according to claim 1, wherein said transparent substrate is also movable in a direction of the optical axis.

4. An apparatus according to claim 3, wherein the direction intersecting the optical axis is perpendicular to the optical axis.

5. An apparatus according to claim 4, wherein said transparent substrate is also movable in the direction of the optical axis.

6. An apparatus according to claim 1, wherein said light quantity adjusting film comprises one of a light blocking member and an ND filter.

7. An apparatus according to claim 1, wherein said light quantity adjusting film includes a plurality of portions each of which is provided in relation to an associated one of different lenses of said plurality of lenses.

8. An apparatus according to claim 7, wherein said plurality of portions includes two types of light quantity adjusting films which are different from each other with respect to at least one of shape and size.

9. An apparatus according to claim 1, further comprising measuring means for measuring an illuminance distribution of light from said optical integrator, upon one of a predetermined plane where the original is placed and a plane optically conjugate with said predetermined plane, wherein said transparent substrate is moved in accordance a measurement by said measuring means.

10. An apparatus according to claim 9, wherein said illumination optical system includes a variable stop disposed at a light exit side of said optical integrator, for changing at least one of shape and size of a secondary light source to be defined with light from said optical integrator, and said transparent substrate is moved in accordance with a change of said secondary light source in size or shape.

11. An apparatus according to claim 1, wherein said illumination optical system includes a variable stop disposed at a light exit side of said optical integrator, for changing at least one of shape and size of a secondary light source to be defined with light from said optical integrator, and said transparent substrate is moved in accordance with a change of said secondary light source in size or shape.

12. An apparatus according to claim 1, wherein lights from said plurality of lenses of said optical integrator illuminate the same portion of the original, and wherein the light entrance side of said optical integrator and a plane where the original is placed are optically conjugate with each other.

13. An apparatus according to claim 1, wherein the light source comprises a lamp.

14. An apparatus according to claim 1, wherein the original is a mask.

15. An apparatus according to claim 1, wherein the light source comprises a laser.

16. An apparatus according to claim 1, wherein the at least one portion of the light quantity adjusting film comprises a dot-like film.

17. An apparatus according to claim 16, wherein said dot-like film has one of a rectangular shape, a circular shape and a fan shape.

18. An apparatus according to claim 1, wherein the at least one portion of the light quantity adjusting film comprises a dot-like opening.

19. An apparatus according to claim 18, wherein said dot-like opening has a ring-like shape.

20. An exposure apparatus for exposing a substrate with a pattern of an original, said apparatus comprising:
an illumination optical system for illuminating the original, said illumination optical system including an optical integrator having a plurality of lenses, and a transparent substrate disposed juxtaposed to a light entrance surface of said optical integrator and having a light quantity adjusting film formed thereon for blocking a portion of light directed to at least one lens of said plurality of lenses, wherein said light quantity adjusting film includes at least one portion which is provided in relation to the at least one lens of said plurality of lenses, said transparent substrate being movable in a direction intersecting an optical axis to thereby change a light quantity distribution on a light entrance surface of the at least one lens so as to change an illuminance distribution on a plane to be illuminated.

21. An apparatus according to claim 20, wherein the at least one portion of the light quantity adjusting film comprises a dot-like film.

22. An apparatus according to claim 21, wherein said dot-like film has one of a rectangular shape, a circular shape and a fan shape.

23. An apparatus according to claim 20, wherein the at least one portion of the light quantity adjusting film comprises a dot-like opening.

24. An apparatus according to claim 23, wherein said dot-like opening has a ring-like shape.

25. An illumination system, comprising:
an optical integrator having a plurality of lenses; and
a transparent substrate disposed juxtaposed to a light entrance surface of said optical integrator and having a light quantity adjusting film formed thereon for blocking a portion of light directed to at least one lens of said plurality of lenses, wherein said light quantity adjusting film includes at least one portion which is provided in relation to the at least one lens of said plurality of lenses, said transparent substrate being movable in a direction intersecting an optical axis to thereby change a light quantity distribution on a light entrance surface of the at least one lens so as to change an illuminance distribution on a plane to be illuminated.

26. An apparatus according to claim 25, wherein the at least one portion of the light quantity adjusting film comprises a dot-like film.

27. An apparatus according to claim 26, wherein said dot-like film has one of a rectangular shape, a circular shape and a fan shape.

28. An apparatus according to claim 25, wherein the at least one portion of the light quantity adjusting film comprises a dot-like opening.

29. An apparatus according to claim 28, wherein said dot-like opening has a ring-like shape.

* * * * *

UNITED STATES PATENT AND TRADEMARK OFFICE
CERTIFICATE OF CORRECTION

PATENT NO. : 6,281,964 B1
DATED : August 28, 2001
INVENTOR(S) : Hiroshi Sato

Page 1 of 1

It is certified that error appears in the above-identified patent and that said Letters Patent is hereby corrected as shown below:

Column 6,
Line 50, "lenses" should read -- lens --.
Line 51, "lens" should read -- lenses --, and "a" should read -- in a --.

Column 7,
Line 23, "3.8 (%)" should read -- 3.8 (%). --.
Line 35, "quantily" should read -- quantity --.

Column 8,
Line 27, "di" should read -- dl --.

Column 12,
Line 19, "packaging" should read -- a packaging --.

Column 13,
Line 31, "a" should read -- with a --.

Signed and Sealed this

Ninth Day of April, 2002

*Attest:*

*Attesting Officer*

JAMES E. ROGAN
*Director of the United States Patent and Trademark Office*